US012632953B2

(12) United States Patent
Wang et al.

(10) Patent No.: US 12,632,953 B2
(45) Date of Patent: May 19, 2026

(54) SEMICONDUCTOR MOLDING SYSTEM AND FOREIGN OBJECT DETECTION METHOD

(71) Applicants: Diodes Incorporated, Plano, TX (US); Shanghai Kaihong Technology Co., Ltd, Shanghai (CN); Diodes Technology (Chengdu) Company Limited, Sichuan (CN); Shanghai Kaihong Electronic Company Limited, Shanghai (CN)

(72) Inventors: Desen Wang, Chengdu (CN); Zhigang Feng, Chengdu (CN)

(73) Assignees: Diodes Incorporated, Plano, TX (US); Shanghai Kaihong Technology Co., Ltd., Shanghai (CN); Diodes Technology (Chengdu) Company Limited, Chengdu (CN); Shanghai Kaihong Electronic Company Limited, Shanghai (CN)

( * ) Notice: Subject to any disclaimer, the term of this patent is extended or adjusted under 35 U.S.C. 154(b) by 315 days.

(21) Appl. No.: 18/533,022

(22) Filed: Dec. 7, 2023

(65) Prior Publication Data

US 2025/0029232 A1    Jan. 23, 2025

Related U.S. Application Data

(63) Continuation of application No. PCT/CN2023/123710, filed on Oct. 10, 2023.

(30) Foreign Application Priority Data

Jul. 17, 2023    (CN) .......................... 202310878511.2

(51) Int. Cl.
    *G06T 7/00*        (2017.01)
    *H10P 72/00*       (2026.01)

(52) U.S. Cl.
    CPC .......... *G06T 7/001* (2013.01); *H10P 72/0441* (2026.01); *H10P 72/06* (2026.01); *G06T 2207/30148* (2013.01)

(58) Field of Classification Search
    CPC .......... G06T 7/001; G06T 2207/30148; G06T 7/0002; G06T 7/0004; H01L 21/67126; H01L 21/67242
    See application file for complete search history.

(56) References Cited

U.S. PATENT DOCUMENTS

| | | | | |
|---|---|---|---|---|
| 2021/0242059 A1* | 8/2021 | Chen | ...................... | G06T 7/001 |
| 2021/0341394 A1* | 11/2021 | Wada | ................ | G01N 21/8851 |
| 2024/0030087 A1* | 1/2024 | Hino | ...................... | H01L 23/36 |

FOREIGN PATENT DOCUMENTS

| | | | | |
|---|---|---|---|---|
| CN | 113937036 A | * | 1/2022 | ....... H01L 21/67126 |
| JP | H0513635 A | * | 1/1993 | |

(Continued)

OTHER PUBLICATIONS

Adimec, Ways to increase throughput in semiconductor and electronics inspection, Oct. 13, 2017. Website. (Year: 2017).*

(Continued)

*Primary Examiner* — Utpal D Shah
*Assistant Examiner* — Jack Peter Kraynak
(74) *Attorney, Agent, or Firm* — AP3 Law Firm PLLC

(57) ABSTRACT

A semiconductor molding system is provided that includes a molding device, an image collection device, and a controller connected to the molding device and the image collection device. The image collection device is configured to obtain a target image of a to-be-molded lead frame before the to-be-molded lead frame is molded by the molding device. The controller is configured to determine whether foreign object(s) exist in a non-molding area of the to-be-molded lead frame based on the target image of the to-be- (Continued)

molded lead frame and a reference image. A method for detecting foreign objects of a to-be-molded lead frame is also provided.

20 Claims, 8 Drawing Sheets

(56)                    References Cited

FOREIGN PATENT DOCUMENTS

JP          H05211260  A  *  8/1993
JP            3669775  B2  *  7/2005

OTHER PUBLICATIONS

Cortex Robotics, What Is a Lead Frame Inspection, What is a lead frame?, Jan. 22, 2021. Website. (Year: 2021).*

* cited by examiner

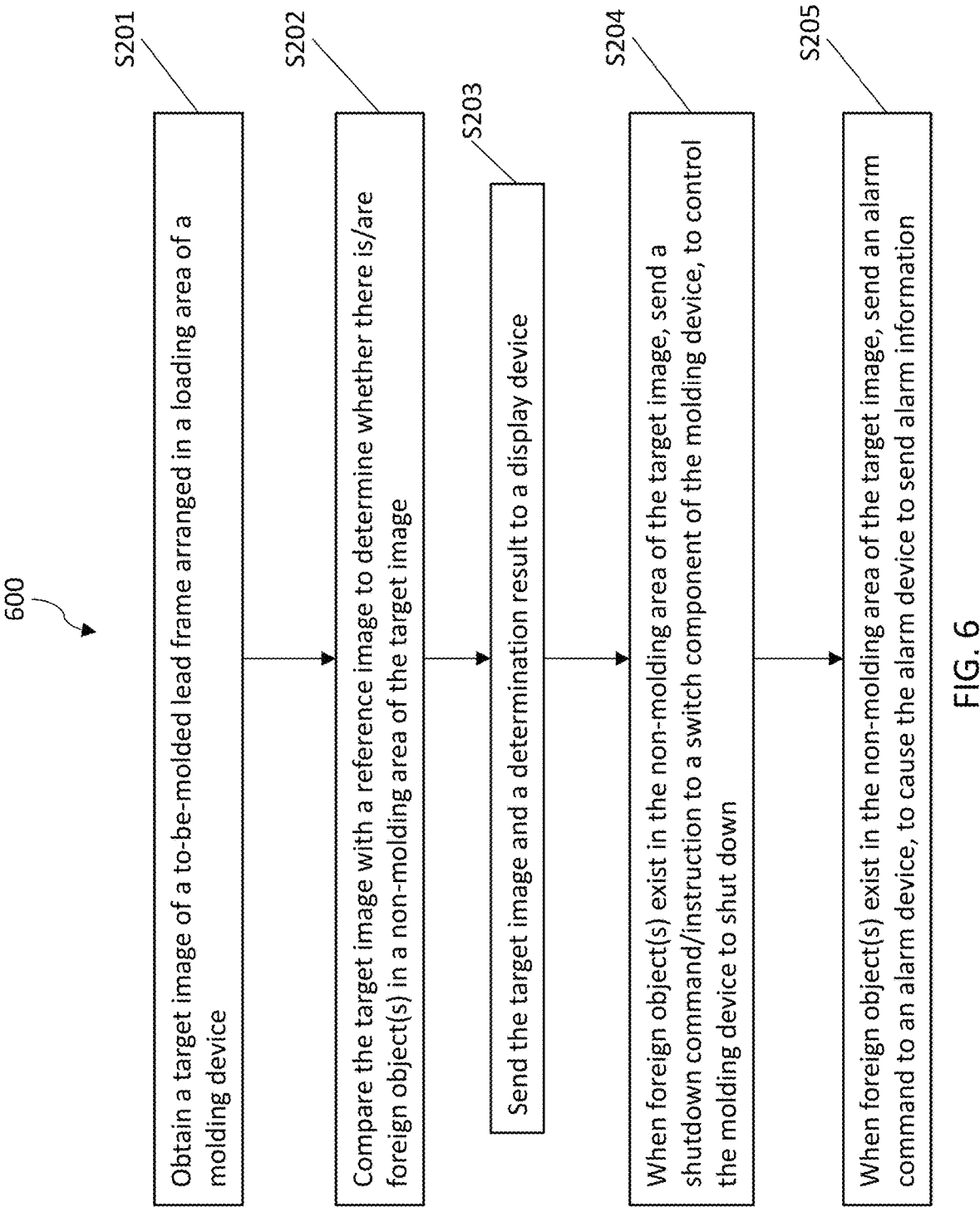

600

S201 — Obtain a target image of a to-be-molded lead frame arranged in a loading area of a molding device S202 — Compare the target image with a reference image to determine whether there is/are foreign object(s) in a non-molding area of the target image S203 — Send the target image and a determination result to a display device S204 — When foreign object(s) exist in the non-molding area of the target image, send a shutdown command/instruction to a switch component of the molding device, to control the molding device to shut down S205 — When foreign object(s) exist in the non-molding area of the target image, send an alarm command to an alarm device, to cause the alarm device to send alarm information

Obtain a target image of a to-be-molded lead frame before the to-be-molded lead frame is molded by a molding device

S302

Determine whether foreign object(s) exist in a non-molding area of the to-be-molded lead frame based on the target image of the to-be-molded lead frame and a reference image configured for the to-be-molded lead frame

SEMICONDUCTOR MOLDING SYSTEM AND FOREIGN OBJECT DETECTION METHOD

CROSS-REFERENCE TO RELATED APPLICATIONS

This patent application is a continuation of International Application No. PCT/CN2023/123710, filed on Oct. 10, 2023 and entitled "Semiconductor molding system and foreign object detection method," which claims priority to Chinese Patent Application No. 202310878511.2, filed on Jul. 17, 2023 and entitled "Semiconductor molding system and foreign object detection method." The aforementioned applications are hereby incorporated by reference herein as if reproduced in their entireties.

TECHNICAL FIELD

The present disclosure relates generally to the field of semiconductor molding, and in particular embodiments, to techniques and mechanisms for a semiconductor molding system and a method for detecting foreign objects.

BACKGROUND

Before the molding process of semiconductor packaging (for example, after a lead frame undergoes the die bond process) is performed, a chip may deflect from its place, or be contaminated with foreign objects. The deflected of the chip and the contamination of foreign objects, during the molding process, may cause problems, such as a mold being unable to clamp properly during the mold clamping process, a crushed surface of a mold, glue overflow in products, crushed leads, and so on. Damages of molds result in high mold expenses and huge cost every year.

In order to avoid the negative impact on product quality and mold cost caused by existence of foreign objects on lead frames, currently, lead frames to be molded are inspected manually, and lead frames with foreign objects existing on surfaces are removed. The manual inspection leads to increased labor costs, and improper operation during the manual inspection may cause more damages.

Therefore, how to solve the above technical problems is a focus of those ordinarily skilled in the art.

SUMMARY

Technical advantages are generally achieved, by embodiments of this disclosure which describe a semiconductor molding system and a foreign object detection method.

An objective of the present disclosure is to provide a semiconductor molding system and a foreign object detection method to reduce labor costs and avoid causing abnormalities in a lead frame to be molded during inspection of the lead frame.

In order to solve the above technical problems, embodiments of the present disclosure provide a semiconductor molding system including a molding device and a foreign object detection device. The foreign object detection device includes an image collection device and a controller. The image collection device is used to collect a target image of a lead frame to be molded located in a loading area, where the loading area is located in the molding device. The controller is used to pre-set a reference image, and compare the target image and the reference image to determine whether there is a foreign object existing in a non-molding area of the target image.

Optionally, the controller is used to select the non-molding area of the target image and compare the non-molding area with the reference image.

Optionally, the controller is used to compare the target image with a non-molding area in the reference image.

Optionally, the controller is connected to a switch component of the molding device. When there is the foreign object existing in the non-molding area of the target image, the controller is further used to send a shutdown command to the switch component, to control the molding device to shut down.

Optionally, the semiconductor molding system also includes: an alarm connected to the controller. The alarm is used to, when the foreign object exists in the non-molding area of the target image, receive an alarm command from the controller and send out an alarm message.

Optionally, the semiconductor molding system also includes: a display device connected to the controller. The display device is used to display the target image and a determination result.

Optionally, the image collection device has a resolution of more than 20 million pixels.

Embodiments of the present disclosure also provide a foreign object detection method before semiconductor molding. The method includes: obtaining a target image of a lead frame that is to be molded and located in a loading area of a molding device; and comparing the target image with a reference image to determine whether foreign object(s) exist in a non-molding area of the target image.

Optionally, when there is a foreign object existing in the non-molding area of the target image, the method further includes: sending a shutdown command to a switch component of the molding device, to control the molding device to shut down.

Optionally, when there is a foreign object existing in the non-molding area of the target image, the method further includes: sending an alarm command to an alarm device to cause the alarm device to issue an alarm message.

Optionally, the method further includes: sending the target image and a determination result to a display device.

Optionally, comparing the target image with the reference image to determine whether foreign object(s) exist in the non-molding area of the target image includes: positioning, in the target image, frame ribs of the lead frame to be molded to determine the non-molding area; and comparing the non-molding area in the target image with the reference image to determine whether there is a foreign object existing in the non-molding area.

An embodiment semiconductor molding system provided in the present disclosure includes a molding device and a foreign object detection device. The foreign object detection device includes an image collection device and a controller. The image collection device is used to collect a target image of a lead frame that is to be molded and located in a loading area. The loading area is located in the molding device. The controller is used to pre-set a reference image, and compare the target image with the reference image to determine whether foreign object(s) exist in a non-molding area of the target image.

Thus, the embodiment semiconductor molding system in the present disclosure includes the molding device and the foreign object detection device. The image collection device in the foreign object detection device may collect the target image of the to-be-molded lead frame placed in the loading area, that is, collect an image of the to-be-molded lead frame before the to-be-molded lead frame is molded. The controller compares the target image of the to-be-molded lead frame, which is an image before the to-be-molded lead frame is molded, with the reference image and performs analysis, and detects/determines whether there is/are foreign object(s) in the non-molding area. The foreign object detection process is performed automatically without the need of manual labor, which saves labor costs. Further, the detection process does not require any contact with the to-be-molded lead frame, and thus does not cause any abnormality in the to-be-molded lead frame during detection.

In addition, embodiments of the present disclosure also provide a foreign object detection method with the above advantages.

In accordance with one aspect of the present disclosure, a semiconductor molding system is provided that includes: a molding device; an image collection device, configured to obtain a target image of a to-be-molded lead frame before the to-be-molded lead frame is molded by the molding device; and a controller coupled to the molding device and the image collection device, the controller being configured to determine whether foreign object(s) exist in a non-molding area of the to-be-molded lead frame based on the target image of the to-be-molded lead frame and a reference image.

In accordance with another aspect of the present disclosure, a method is provided that includes: obtaining a target image of a to-be-molded lead frame before the to-be-molded lead frame is molded by a molding device; and determining whether foreign object(s) exist in a non-molding area of the to-be-molded lead frame based on the target image of the to-be-molded lead frame and a reference image configured for the to-be-molded lead frame.

In accordance with yet another aspect of the present disclosure, an apparatus is provided that includes: a molding device configured to mold lead frames; a foreign object detection device comprising an image collection device and a controller, wherein the image collection device is configured to obtain a target image of a to-be-molded lead frame arranged in the molding device, and the controller is configured to pre-set a reference image for the to-be-molded lead frame, and to compare the target image and the reference image to determine whether foreign object(s) exist in a non-molding area of the to-be-molded lead frame; and an alarm device connected to the controller, the alarm device being configured to, when there is a foreign object existing in the non-molding area, issue an alarm message upon receiving an instruction from the controller.

BRIEF DESCRIPTION OF THE DRAWINGS

In order to more clearly illustrate technical solutions in embodiments of the present application or existing technologies, drawings in the embodiments of the present application or existing technologies are briefly described in the following. Obviously, the drawings in the following description are only some embodiments of the application, and those of ordinary skill in the art may also obtain other drawings based on these drawings without taking creative efforts.

For a more complete understanding of the present disclosure, and the advantages thereof, reference is now made to the following descriptions taken in conjunction with the accompanying drawings, in which:

FIG. 6 is a flowchart of another example method for detecting foreign objects according to embodiments of the present disclosure, which is applicable in a semiconductor molding system;

Figure 1:
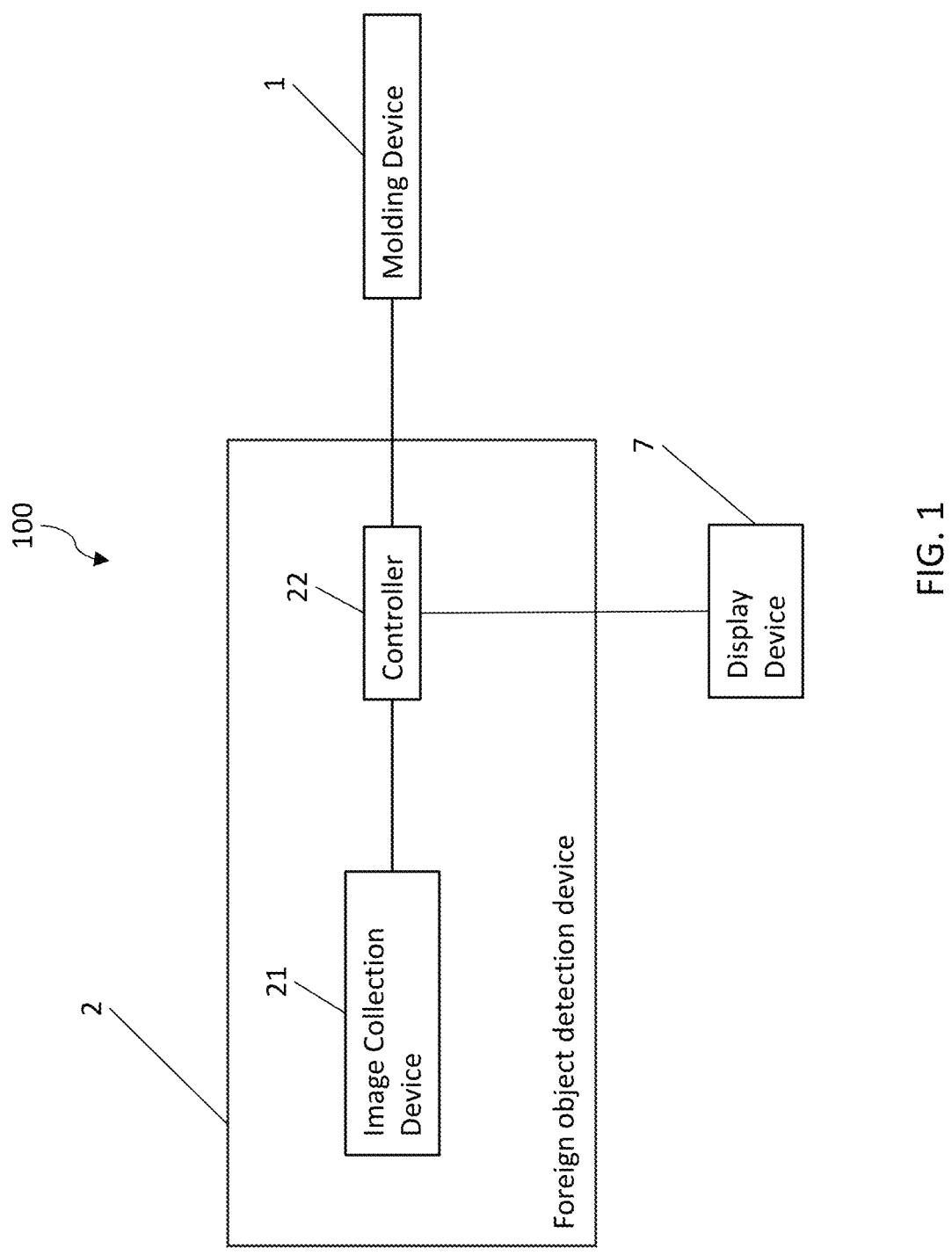
FIG. 1 is a structural diagram of an example semiconductor molding system according to embodiments of the present disclosure.

In the drawings, 1: a molding device; 2: a foreign object detection device; 21: an image collection device; 22: a controller; 3: an alarm device.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

In order to enable those of ordinary skill in the art to better understand solutions of the present disclosure, embodiments of the present disclosure will be described in detail below in conjunction with the accompanying drawings. Obviously, the described embodiments are some embodiments of the present disclosure, rather than all embodiments. Based on the embodiments of the present disclosure, all other embodiments obtained by those of ordinary skill in the art without creative efforts fall within the protection scope of the present disclosure.

Specific details are provided in the following description to facilitate understanding of the present disclosure. However, the present disclosure may also be implemented in other ways different from those described here. Those of ordinary skill in the art may implement the present disclosure in various ways without departing from the principle and spirit of the present disclosure. Therefore, the present disclosure is not intended to be limited by the specific embodiments disclosed in the following.

As mentioned above, currently, lead frames to be molded (or to-be-molded lead frames) are inspected manually, and lead frames with foreign objects existing on the surfaces are excluded. The manual inspection leads to an increase in labor costs, and improper operation during the manual inspection may also cause more damages.

Embodiments of the present disclosure provide a semi-conductor molding system 100, as shown in FIG. 1. The semiconductor molding system 100 includes a molding device 1 and a foreign object detection device 2. The foreign object detection device 2 includes an image collection device 21 and a controller 22. The image collection device 21 is configured to collect one or more target images of a to-be-molded lead frame that is located in a loading area. The loading area is located in the molding device 1. The controller 22 is configured to pre-set a reference image, and compare a target image with the reference image, to detect/determine whether there is/are foreign object(s) existing in a non-molding area/region of the target image.

For the structure of the molding device 1 in this embodiment, reference may be made to molding devices/apparatuses in the related art for molding lead frames, and the related description will not be repeated herein.

The image collection device 21 may be arranged in the loading area of the molding device 1. The loading area of the molding device 1 may include a loading track, and a to-be-molded lead frame is arranged on the loading track, waiting to be molded. The image collection device 21 may be a device that can collect images, such as a camera, a video camera, and so on, and is not specifically limited in this embodiment.

In order to improve the detection accuracy of foreign objects, the image collection device 21 may have a resolution that is greater than 20 million pixels, with which, the detection accuracy can reach 0.1×0.1 mm.

The image collection device 21 may transmit collected target images to the controller 22. The target images may be transmitted using wireless transmission or wired transmission. When wireless transmission is adopted, in one example, the image collection device 21 may be integrated with wireless transmission component(s). In another example, the foreign object detection device 2 may include wireless transmission component(s), which are connected to the image collection device 21 and the controller 22, respectively. A wireless transmission component may be a Bluetooth transmission component, a Wi-Fi transmission component, and so on.

The controller 22 may include, but is not limited to, a microcontroller, or a microcontroller unit (MCU).

In an embodiment, a process where the controller 22 compares the target image of the to-be-molded lead frame with the reference image includes: determining a position of a frame rib of the to-be-molded lead frame in the target image of the to-be-molded lead frame, to determine the non-molding area; and comparing the non-molding area in the target image with the reference image to determine whether there is a foreign object in the non-molding area. That is, the controller selects the non-molding area of the target image and compares the non-molding area with the reference image.

The non-molding area is an area on the to-be-molded lead frame that will not be molded during molding of the to-be-molded lead frame. As an example, referring to FIG. 2, the black rectangular blocks represent areas to be molded, and the remaining area excluding the black rectangular blocks is the non-molding area.

Before determining the position of the frame rib in the target image of the to-be-molded lead frame, an embodiment may include: performing visual positioning to identify the to-be-molded lead frame in the target image.

In another embodiment, in the process where the controller 22 compares the target image of the to-be-molded lead frame with the reference image, the controller 22 may be configured to compare the target image with a non-molding area in the reference image.

The reference image is an image of the lead frame when the lead frame does not have any foreign object (e.g., deflection, scattered chips, contamination with other foreign objects, and so on).

In an embodiment, the semiconductor molding system may also include a display device 7 connected to the controller 22 for displaying the target images and determination results. The display device may be a display screen of an electronic device, e.g., a computer, a laptop, a desk top, a smart phone, a tablet, and so on.

There may be two determination results. One is that the to-be-molded lead frame has foreign object(s), and the other one is that the to-be-molded lead frame has no foreign object. As an example, a first determination result indicates that there is/are foreign object(s) existing in a non-molding area/region of the to-be-molded lead frame, and a second determination result indicates that there is no foreign object existing in the non-molding area/region of the to-be-molded lead frame, which are determined based on the comparison of the target image and the reference image.

Figure 2:
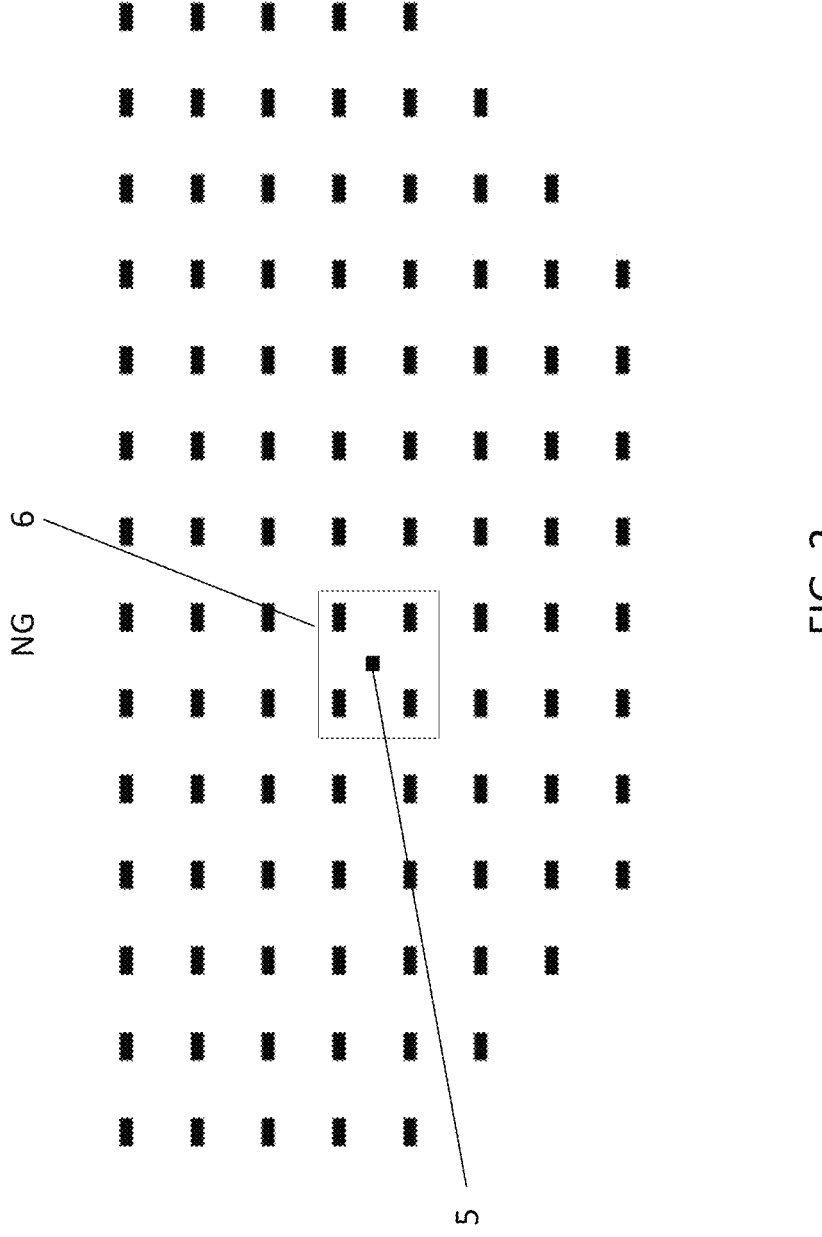
FIG. 2 is a schematic diagram of an example to-be-molded lead frame which is determined to be a not good (NG) product according to embodiments of the present disclosure.
Figure 3:
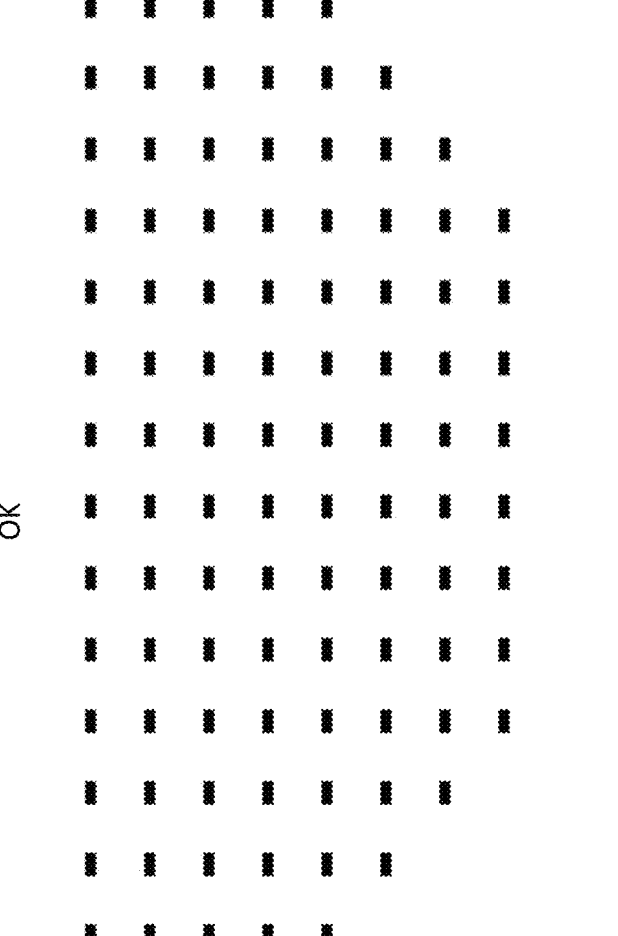
FIG. 3 is a schematic diagram of an example to-be-molded lead frame which is determined to be a good product according to embodiments of the present disclosure.

When the to-be-molded lead frame has foreign object(s), as shown in FIG. 2 as an example where a foreign object 5 exists in an area indicated by a box 6, the to-be-molded lead frame may be determined to be a not good (NG) product. When the to-be-molded lead frame does not have foreign object, as shown in FIG. 3 as an example, the to-be-molded lead frame may be determined to be a good (or OK) product.

In above embodiments, the semiconductor molding system includes a molding device 1 and a foreign object detection device 2. The image collection device 21 in the foreign object detection device 2 may collect a target image of the to-be-molded lead frame placed in the loading area, that is, collect an image of the to-be-molded lead frame before the to-be-molded lead frame is molded. The controller 22 compares the target image of the to-be-molded lead frame, which is an image before the to-be-molded lead frame is molded, with the reference image and performs analysis, and detects/determines whether there is/are foreign object(s) in the non-molding area. The foreign object detection process is performed automatically without the need of manual labor, which saves labor costs. Further, the detection process does not require to have any contact with the to-be-molded lead frame, and thus does not cause any abnormality in the to-be-molded lead frame during detection.

Based on the above embodiments, in one further embodiment, the controller 22 nay be connected to a switch component of the molding device 1. When there is/are foreign object(s) in the non-molding area of the target image, the controller 22 may be configured to send a shutdown command to the switch component to control the molding device 1 to shut down or pause operating.

The controller 22 may communicate with the switch component of the molding device 1. When the to-be-molded lead frame has foreign object(s), the controller 22 may control the molding device 1 to automatically shut down or pause operating, so that personnels can inspect the to-be-molded lead frame having foreign object(s), and clear the foreign object(s) to ensure that the mold will not be crushed or affected.

Figure 4:
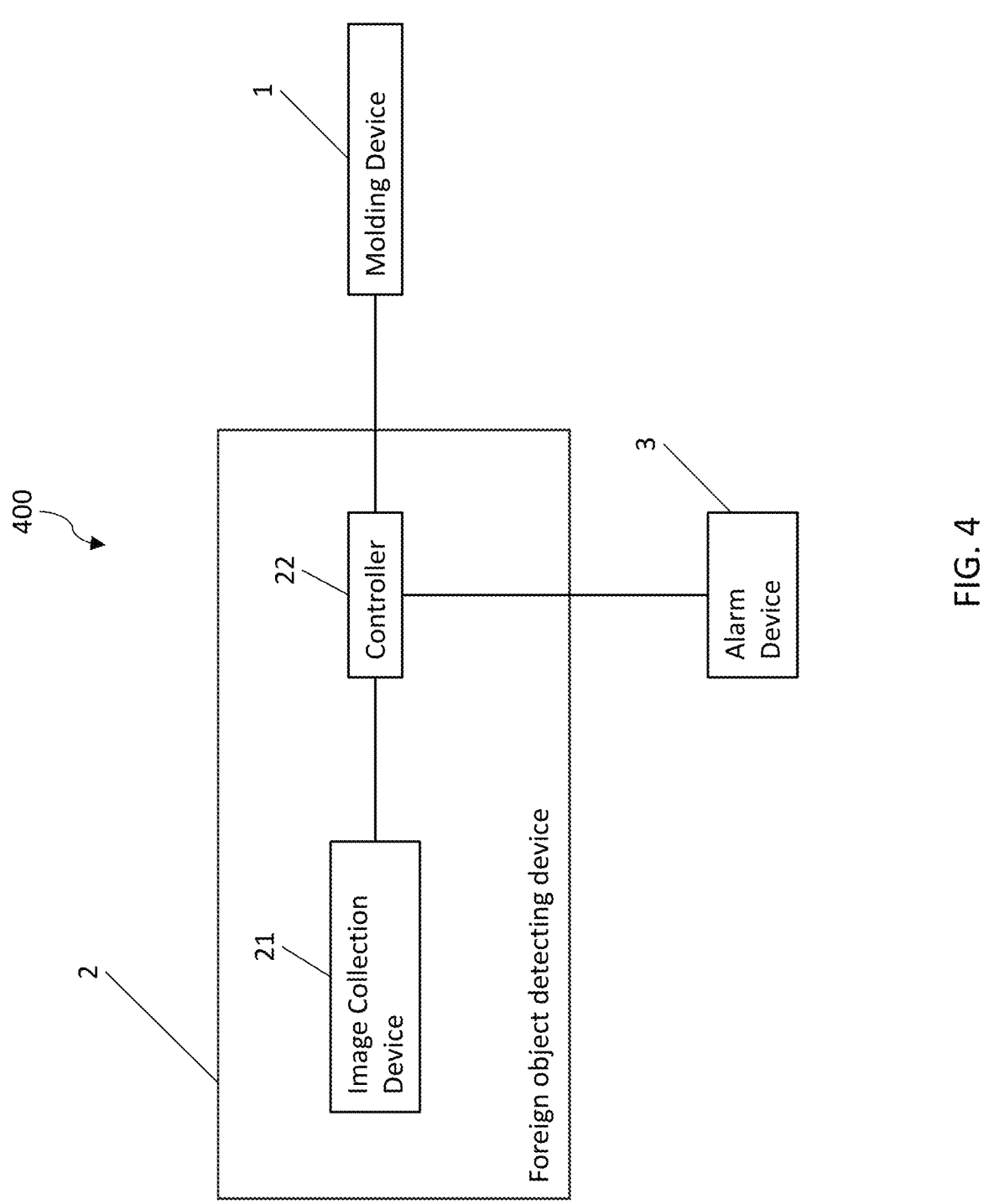
FIG. 4 is a schematic structural diagram of another example semiconductor molding system according to embodiments of the present disclosure.

Referring to FIG. 4, based on any of the above embodiments, in one further embodiment of the present disclosure, a semiconductor molding system 400 similar to the semiconductor molding system 100 may also include an alarm device 3 connected to the controller 22. The alarm device 3 is configured to, when foreign object(s) exist in the non-molding area of the target image, receive an alarm instruction/command from the controller 22 and issue alarm information, e.g., an alarm message, based on the alarm instruction/command.

It should be noted that the alarm device 3 in this embodiment may be an alarm device 3 additionally configured, or an alarm device 3 installed in the semiconductor molding system.

The alarm device 3 may be any one of a sound alarm, a light alarm, a text alarm, or any combination thereof.

In this embodiment, when there exists a foreign object on the to-be-molded lead frame, the controller 22 may control the alarm device 3 to send out an alarm message, so as to promptly notify the personnels of the existence of foreign object(s) on the to-be-molded lead frame. Accordingly, the to-be-molded lead frame in the loading area having the foreign object(s) can be processed and the foreign object can be cleared, which can avoid the mold from being crushed. Thus, alarm information notifies the existence of foreign object(s) on a to-be-molded lead frame, based on which, personnels may try to clear the foreign object(s), or discard the to-be-molded lead frame when failing to clear the foreign object(s).

Figure 5:
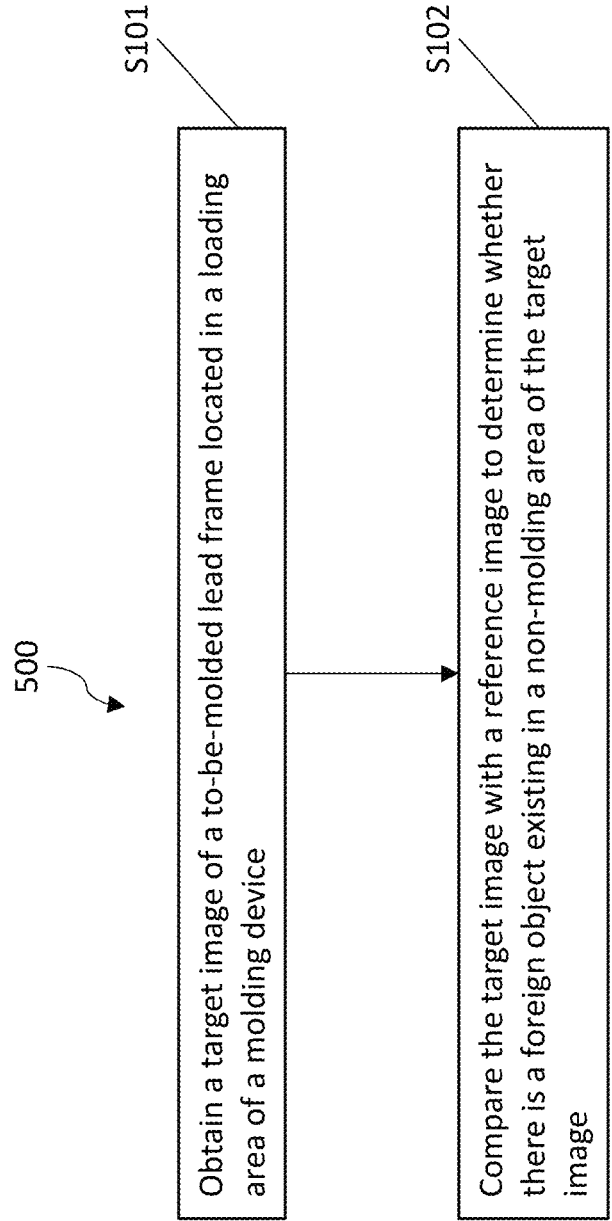
FIG. 5 is a flowchart of an example method for detecting foreign objects according to embodiments of the present disclosure, which is applicable in a semiconductor molding system.

Referring to FIG. 5, embodiments of the present disclosure also provide a method 500 for detecting foreign objects before semiconductor molding is performed. The method 500 includes following steps.

Step S101: Obtain a target image of a to-be-molded lead frame located in a loading area of a molding device.

This embodiment does not limit the method of obtaining the target image of the to-be-molded lead frame and the positioning method, and the methods may be determined depending on the applications. For example, the target image may be obtained through a wired mechanism, or a wireless mechanism. The wireless mechanism may include, but is not limited to, Bluetooth transmission, or Wi-Fi transmission.

In this embodiment, collection and inspection of the target image of the to-be-molded lead frame placed in the loading area are completed before molding, and do not require a separate apparatus/device and process.

Step S102: Compare the target image with a reference image to determine whether there is a foreign object existing in a non-molding area of the target image.

The reference image is an image of the lead frame when the lead frame does not have any foreign object (e.g., deflection, scattered chips, contamination with other foreign objects, and so on).

In an embodiment, comparing the target image with the reference image to determine whether there is a foreign object in the non-molding area of the target image may include: determining, in the target image, the position of the frame rib of the to-be-molded lead frame, to determine the non-molding area; and comparing the non-molding area in the target image with the reference image to determine whether there exists a foreign object in the non-molding area.

The to-be-molded lead frame is fixed, and thus, determining the position of the frame rib determines the position of the non-molding area, that is, the position of a detection area on the to-be-molded lead frame.

Figure 7:
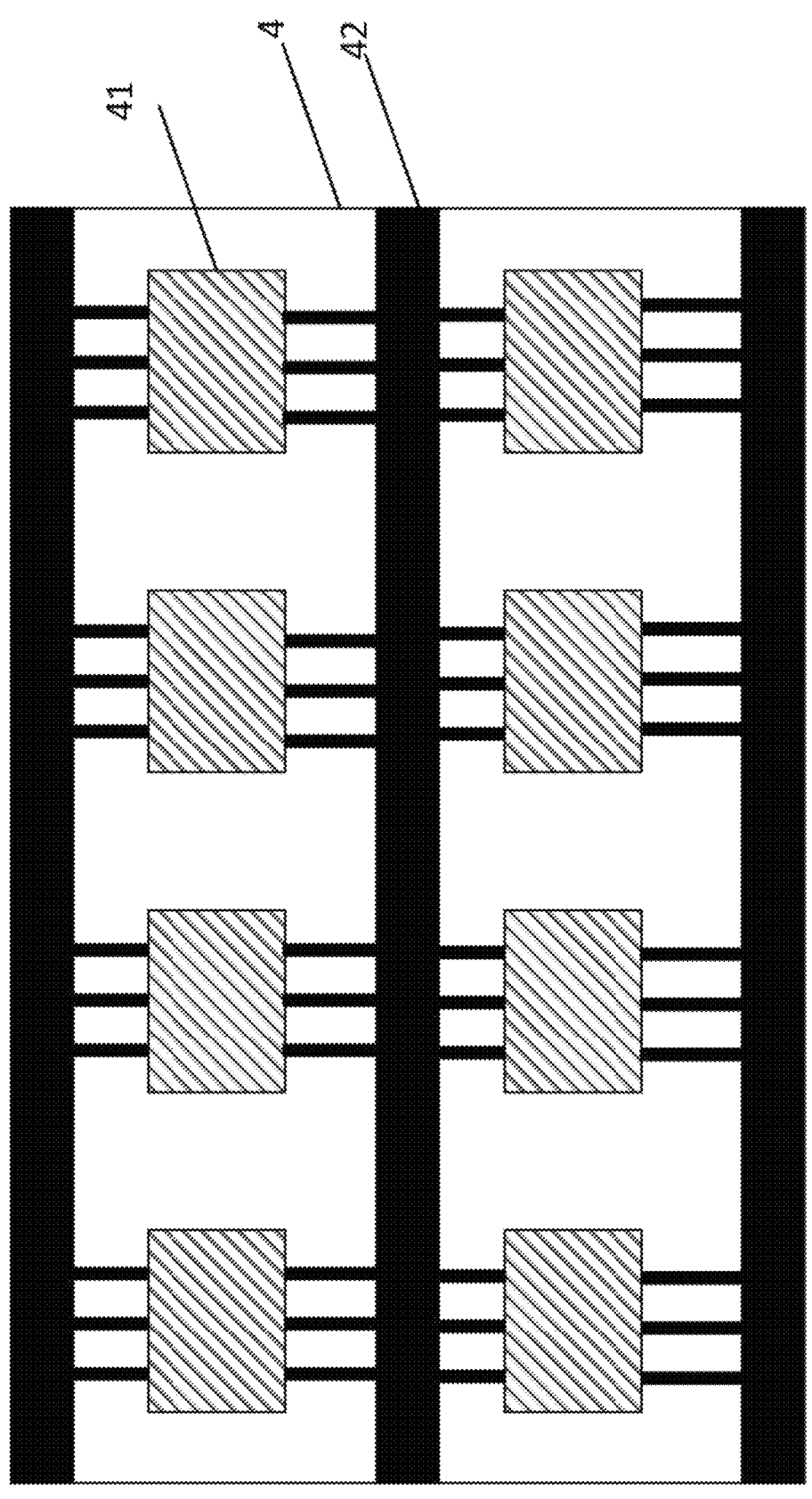
FIG. 7 is a schematic diagram of an example target image of a to-be-molded lead frame according to embodiments of the present disclosure.

As shown in FIG. 7, a to-be-molded lead frame 4 includes chip(s) 41 and frame rib(s) 42. The area where the chip(s) 41 are located is a non-detection area, and the remaining area excluding the non-detection area is a detection area of the to-be-molded lead frame 4. The detection area is the non-molding area to be detected and inspected to determine whether foreign object(s) exist.

Before determining the position(s) of the frame rib(s) in the target image of the to-be-molded lead frame, an embodiment may include: performing visual positioning to determine the to-be-molded lead frame in the target image.

The process of comparing the target image with the reference image to determine whether there is a foreign object existing in the non-molding area of the target image may be implemented using the Golden Unit model, which can provide a comprehensive comparison regarding the foreign objects outside the cavity (non-detection area), and prevent missed detection.

In an embodiment, the method for detecting foreign objects may also include: sending the target image and a determination result to a display device, to display the target image and a determination result on the display device, e.g., a screen.

In above embodiments, the method for detecting foreign objects obtains the target image of the to-be-molded lead frame when the to-be-molded lead frame is located in the loading area, i.e., collects/captures the image of the to-be-molded lead frame before being molded, and then compares and analyzes the target image and the reference image to detect whether foreign object(s) exist in the non-molding area of the target image. The foreign object detection process is completed automatically without manual labor involved, which saves labor costs. Further, the detection process does not need to have any contact with the to-be-molded lead frame, and does not cause any abnormality in the to-be-molded lead frame during detection.

Based on the above embodiments, in one further embodiment, when a foreign object exists in the non-molding area of the target image, the method may further include: sending a command/instruction, e.g., a shutdown command or a pause command, to a switch component of the molding device to control the molding device to shut down (or pause operating).

After the molding device is shut down or paused, personnels can process the to-be-molded lead frame having foreign object(s), and clear the foreign object(s) to ensure that the mold will not be crushed.

Based on any of the above embodiments, in an embodiment of the present disclosure, referring to FIG. 6, a method 600 for detecting foreign objects may include following steps.

Step S201: Obtain a target image of a to-be-molded lead frame located in a loading area of a molding device.

Step S202: Compare the target image with a reference image to determine whether there is/are foreign object(s) in a non-molding area of the target image.

Step S203: Send the target image and a determination result to a display device.

Step S204: When foreign object(s) exist in the non-molding area of the target image, send a shutdown command/instruction to a switch component of the molding device, to control the molding device to shut down.

In an embodiment, an instruction may be sent to the molding device to instruct the molding device to pause operation or shut down.

Step S205: When foreign object(s) exist in the non-molding area of the target image, send an alarm command to an alarm device, to cause the alarm device to send alarm information.

In this embodiment, the type of the alarm information is not limited, and may be determined based on applications. For example, the alarm information can be any one of sound alarm information, light alarm information, text alarm information, or any combination thereof.

It should be noted that step S204 and Step S205 may be performed in a different order than that shown in FIG. 6. For example, Step S205 may be performed before, after or at the same time as Step S204.

In above embodiments, when there is/are foreign object(s) existing on the to-be-molded lead frame, the alarm device is controlled to send the alarm information, so as to promptly notify the personnels of the existence of the foreign object(s) on the to-be-molded lead frame. Accordingly, the to-be-molded lead frame in the loading area having the foreign object(s) can be processed to get the foreign object cleared, avoiding the mold from being crushed.

Figure 8:
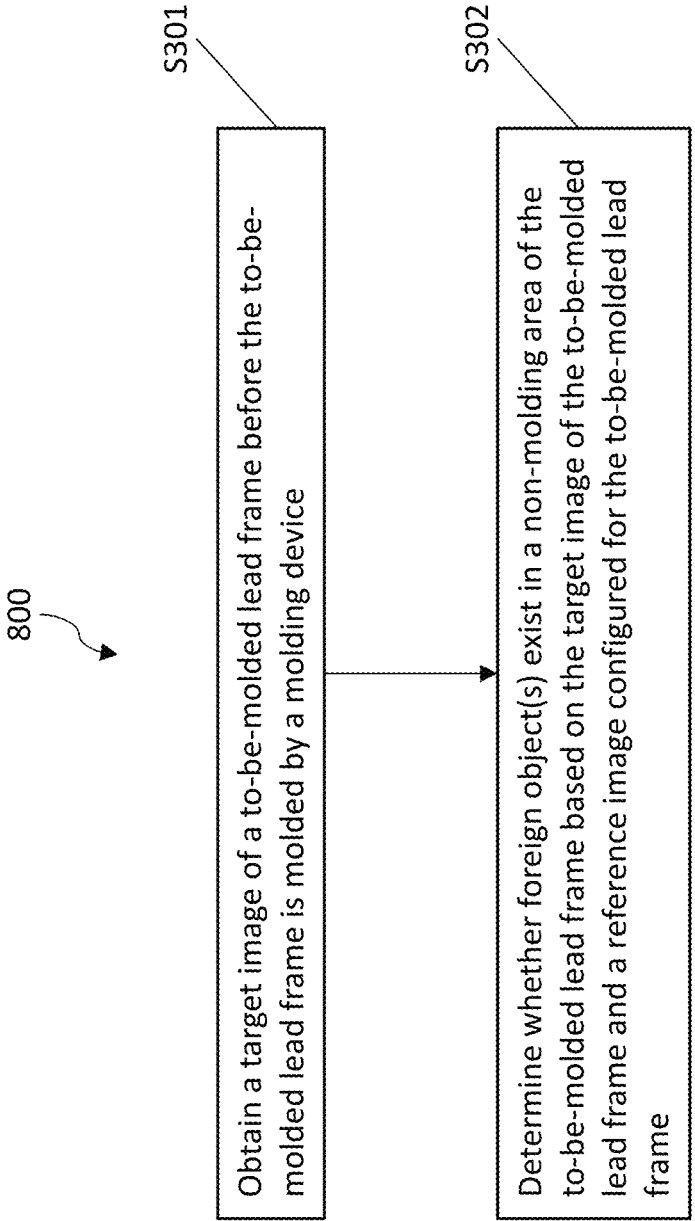
FIG. 8 is a flowchart of yet another example method for detecting foreign objects according to embodiments of the present disclosure, which is applicable in a semiconductor molding system.

FIG. 8 is a flowchart of an example method 800 for semiconductor molding according to embodiments of the present disclosure. The method 800 may be performed for a to-be-molded lead frame at a semiconductor molding system as described above before molding is conducted to the to-be-molded lead frame. As show, the method 800 includes obtaining a target image of a to-be-molded lead frame before the to-be-molded lead frame is molded by a molding device (step S301). The method 800 further includes determining whether foreign object(s) exist in a non-molding area of the to-be-molded lead frame based on the target image of the to-be-molded lead frame and a reference image configured for the to-be-molded lead frame (step S302).

The methods as described above with respect to FIGS. 6-8 may be performed by a controller of a semiconductor molding system, e.g., the controller 22 as described with respect to FIG. 1 and FIG. 4.

In some embodiments, when determining that no foreign object exists in the non-molding area of the to-be-molded lead frame, the controller may be configured to instruct the molding device to mold the to-be-molded lead frame. The controller may send, to the molding device, an instruction or command instructing the molding device to start the molding process on the to-be-molded lead frame. Upon receiving the instruction/command, the molding device may start molding the to-be-molded lead frame.

EMBODIMENTS of the present disclosure are described in a progressive manner. Each embodiment is described with an emphasis on its difference from other embodiments. The same or similar parts in various embodiments may be referred to each other.

The semiconductor molding systems and the methods for detecting foreign objects provided by the embodiments of the present disclosure have been described in detail above. In the present disclosure, specific examples are used to illustrate the principle and implementation of the present disclosure. The descriptions of the above embodiments are only used to help understand the technical solutions and core ideas of the present disclosure. It is noted that those of ordinary skill in the art could still make modifications and alterations to the embodiments of the present disclosure without departing from the principle of the present disclo-sure, and these modifications and alterations also fall in the protection scope of the present disclosure.

Although the description has been described in detail, it should be understood that various changes, substitutions and alterations can be made without departing from the spirit and scope of this disclosure as defined by the appended claims. Moreover, the scope of the disclosure is not intended to be limited to the particular embodiments described herein, as one of ordinary skill in the art will readily appreciate from this disclosure that processes, machines, manufacture, com-positions of matter, means, methods, or steps, presently existing or later to be developed, may perform substantially the same function or achieve substantially the same result as the corresponding embodiments described herein. Accord-ingly, the appended claims are intended to include within their scope such processes, machines, manufacture, compo-sitions of matter, means, methods, or steps.

What is claimed:

1. A semiconductor molding system, comprising:
a molding device;
an image collection device, configured to obtain a target image of a to-be-molded lead frame before the to-be-molded lead frame is molded by the molding device; and
a controller coupled to the molding device and the image collection device, the controller being configured to:
determine, before the to-be-molded lead frame is molded, a position of a non-molding area in the target image of the to-be-molded lead frame by determining a position of a frame rib of the to-be-molded lead frame in the target image; and
determine, before the to-be-molded lead frame is molded, whether foreign object(s) exist in the non-molding area of the to-be-molded lead frame based on the target image of the to-be-molded lead frame and a reference image.

2. The semiconductor molding system of claim 1, wherein the controller is further configured to:
compare, before the to-be-molded lead frame is molded, the non-molding area in the target image with the reference image to determine whether the foreign object(s) exist in the non-molding area of the to-be-molded lead frame.

3. The semiconductor molding system of claim 1, wherein the controller is further configured to:
compare the non-molding area in the target image with a non-molding area in the reference image to determine whether the foreign object(s) exist in the non-molding area of the to-be-molded lead frame.

4. The semiconductor molding system of claim 1, wherein the controller is further configured to:
instruct to shut down the molding device when determin-ing that there is a foreign object in the non-molding area of the to-be-molded lead frame.

5. The semiconductor molding system of claim 1, further comprising:
an alarm device connected to the controller, the alarm device being configured to issue, under control of the controller, an alarm message when there is a foreign object in the non-molding area of the to-be-molded lead frame.

6. The semiconductor molding system of claim 5, wherein the controller is further configured to:
send an instruction to the alarm device instructing the alarm device to issue the alarm message.

7. The semiconductor molding system of claim 1, wherein the controller is further configured to:

control to display, on a display device, the target image and a determination result of whether the foreign object(s) exist in the to-be-molded lead frame.

8. The semiconductor molding system of claim 1, wherein the image collection device has a resolution of above 20 million pixels.

9. The semiconductor molding system of claim 1, wherein the controller is further configured to:

instruct the molding device to mold the to-be-molded lead frame when determining that there is no foreign object in the non-molding area of the to-be-molded lead frame.

10. A method comprising:

obtaining a target image of a to-be-molded lead frame before the to-be-molded lead frame is molded by a molding device;

determining, before the to-be-molded lead frame is molded, a position of a non-molding area in the target image of the to-be-molded lead frame based on a position of a frame rib of the to-be-molded lead frame in the target image; and determining, before the to-be-molded lead frame is molded, whether foreign object(s) exist in the non-molding area of the to-be-molded lead frame based on comparing the non-molding area of the target image of the to-be-molded lead frame and a non-molding area of a lead frame in a reference image configured for the to-be-molded lead frame.

11. The method of claim 10, further comprising:

when determining that there is a foreign object in the non-molding area, controlling to shut down the molding device.

12. The method of claim 11, wherein controlling to shut down the molding device comprises:

sending an instruction to the molding device instructing the molding device to shut down.

13. The method of claim 10, further comprising:

when determining that there is a foreign object in the non-molding area of the to-be-molded lead frame, instructing an alarm device to issue an alarm message.

14. The method of claim 10, further comprising:

sending, to a display device for display before the to-be-molded lead frame is molded, the target image of the to-be-molded lead frame and a determination result of whether the foreign object(s) exist in the non-molding area of the to-be-molded lead frame.

15. The method of claim 10, wherein determining whether the foreign object(s) exist in the non-molding area of the to-be-molded lead frame comprises:

comparing, before the to-be-molded lead frame is molded, the non-molding area in the target image with the reference image, to determine whether a foreign object exists in the non-molding area of the to-be-molded lead frame.

16. An apparatus comprising:

a foreign object detection device comprising;

an image collection device configured to obtain, before a to-be-molded lead frame is molded, a target image of the to-be-molded lead frame arranged in a molding device, and a controller configured to:

pre-set a reference image for the to-be-molded lead frame;

determine, before the to-be-molded lead frame is molded, a position of a non-molding area in the target image of the to-be-molded lead frame by determining a position of a frame rib of the to-be-molded lead frame in the target image; and, compare, before the to-be-molded lead frame is molded, the target image and the reference image to determine whether foreign object(s) exist in the non-molding area of the to-be-molded lead frame; and an alarm device connected to the controller, the alarm device being configured to, when there is a foreign object in the non-molding area, issue an alarm message upon receiving an instruction from the controller.

17. The apparatus of claim 16, further comprising:

a display device connected to the controller, the display device being configured to receive, from the controller before the to-be-molded lead frame is molded, the target image and a determination result of whether the foreign object(s) exist in the non-molding area of the to-be-molded lead frame, and display the target image and the determination result.

18. The apparatus of claim 16, wherein the controller is further configured to:

compare, before the to-be-molded lead frame is molded, the non-molding area in the target image with the reference image to determine whether the foreign object(s) exist in the non-molding area of the to-be-molded lead frame.

19. The apparatus of claim 16, wherein the controller is further configured to send an instruction to the molding device instructing the molding device to shut down, when determining that there is a foreign object in the non-molding area of the to-be-molded lead frame.

20. The semiconductor molding system of claim 1, wherein the image collection device provides a detection accuracy of about 0.1×0.1 mm.

* * * * *